United States Patent [19]
Sugimoto

[11] Patent Number: 6,049,895
[45] Date of Patent: Apr. 11, 2000

[54] FAILURE ANALYZER WITH DISTRIBUTED DATA PROCESSING NETWORK AND METHOD USED THEREIN

[75] Inventor: Masaaki Sugimoto, Tokyo, Japan

[73] Assignee: NEC Corporation, Tokyo, Japan

[21] Appl. No.: 08/985,918

[22] Filed: Dec. 8, 1997

[30] Foreign Application Priority Data

Dec. 9, 1996 [JP] Japan .................................. 8-328712

[51] Int. Cl.[7] .................................................. G06F 11/00
[52] U.S. Cl. ............................................. 714/46; 709/203
[58] Field of Search ........................ 709/203; 714/25–46

[56] References Cited

U.S. PATENT DOCUMENTS

| | | | |
|---|---|---|---|
| 3,962,687 | 6/1976 | Suzumura et al. | 340/173 R |
| 4,369,511 | 1/1983 | Kimura et al. | 371/21 |
| 4,460,999 | 7/1984 | Schmidt | 371/21 |
| 5,216,673 | 6/1993 | Kanai | 371/21.2 |
| 5,219,765 | 6/1993 | Yoshida et al. | 437/8 |
| 5,410,687 | 4/1995 | Fujisaki et al. | 395/575 |
| 5,463,459 | 10/1995 | Morioka et al. | 356/237 |
| 5,598,341 | 1/1997 | Ling et al. | 364/468.17 |
| 5,610,925 | 3/1997 | Takahashi | 371/22.1 |
| 5,883,710 | 3/1999 | Nikoonahad et al. | 356/237.2 |

FOREIGN PATENT DOCUMENTS

| | | |
|---|---|---|
| 60-134370 | 7/1985 | Japan . |
| 2-30534 | 7/1990 | Japan . |
| 4-299765 | 10/1992 | Japan . |
| 7-72206 | 3/1995 | Japan . |
| 7-270836 | 10/1995 | Japan . |
| 8-4467 | 2/1996 | Japan . |

OTHER PUBLICATIONS

Japanese Office Action dated Sep. 29, 1998 with English language translation of Japanese Examiner's comments.

*Primary Examiner*—Ayaz R. Sheikh
*Assistant Examiner*—Jigar Pancholi
*Attorney, Agent, or Firm*—Whitham, Curtis & Whitham

[57] ABSTRACT

A failure analyzer has an electric characteristic inspection system for producing pieces of electric test data information for integrated circuit devices fabricated on a semiconductor wafer, a visual inspection system for producing pieces of appearance test data information for the semiconductor wafer and a data analyzing system for producing a failure analysis report from the pieces of electric test data information and the pieces of appearance test data information, and the data analyzing system is implemented by using a client-server network technology so as to increase a data processing capability depending upon the amount of data to be analyzed.

8 Claims, 7 Drawing Sheets

FAILURE ANALYZER WITH DISTRIBUTED DATA PROCESSING NETWORK AND METHOD USED THEREIN

FIELD OF THE INVENTION

This invention relates to a failure analyzer used in a trouble-shooting for a semiconductor manufacturing and, more particularly, to a failure analyzer with a distributed data processing network and a method used therein.

DESCRIPTION OF THE RELATED ART

Semiconductor device manufacturers checks products of a semiconductor integrated circuit device before delivery to user to see whether or not the product contains a defect. The inspection items are broken down into a visual inspection test and a characteristic inspection test. A failure analyzer investigates the dispersion of contaminant, pattern defects and electrical failures, and analyzes the relation therebetween. Such a composite failure analyzer is manufactured by KLA Corporation in the United States of America. Although the failure analyzer specifies the position and the size of each visual defect, an operator confirms each of the visual defects so as to categorize the defects into defect items. If the fabrication factory is sufficiently clean and the fabrication is appropriately controlled, the visual defects on a single semiconductor wafer are of the order of tens thousand, and a single data processor can analyze the defects. However, when a trouble takes place in the fabrication line, the visual defects are increased to millions per semiconductor wafer, and it is impossible for the single data processor to analyze the defects. For this reason, a plurality of data processors participate the failure analysis.

Japanese Patent Publication of Unexamined Application No. 4-299765 discloses a quality control system associated with a manufacturing line. The quality control system comprises a plurality of local manager computers and a supervisor computer connected to one another through a communicating network, and the manufacturing line contains a plurality of manufacturing apparatus groups. The plurality of manufacturing apparatus groups are associated with controlling computers, and the controlling computers monitor the associated manufacturing apparatus groups so as to obtain process data. Process steps are assigned to the manufacturing apparatus groups, and the controlling computers are respectively connected to the local manager computers. The local manager computers store management data, and a data base for the process step assigned thereto, a product specification master and an apparatus specification master are incorporated in the management data.

The controlling computer supplies the process data to the associated local manager computer, and the local manager computer analyzes the process data for the quality control. If the local manager computers find process data indicative of trouble, the local manager computer informs the controlling computer of the trouble, and produces an alarm. In this way, the controlling computers and the associated local manager computers communicate with one another.

The local manager computers are connected to the supervisor computer. While the manufacturing apparatus groups are working without a trouble, the local manager computers reports the working results to the supervisor computer, and the supervisor computer controls the process flow.

One of the manufacturing apparatus groups serves as a memory tester, and the memory tester checks products of the memory device fabricated on a semiconductor wafer. The storage density of the memory device has been increased, and the semiconductor wafer has been scaled up. For this reason, the process data or test data is getting more and more. If the amount of test data exceeds over the capacity of the associated local manager computer, the local manager computer can not process the process data, and only one option would be to replace the manager computer.

Another related prior art is disclosed in Japanese Patent Publication of Unexamined Application No. 7-270836. The Japanese Publication of Unexamined Application discloses a development supporting system for organic non-linear optical crystal products. The prior art development supporting system aims at simplification of input step for calculation of molecular orbit and approximate calculation of orientation gas model. The prior art development supporting system includes two data processing units. One of the data processing units is assigned to calculation of non-linear coefficient, and the other data processing unit is assigned to an analysis for an x-ray crystal structure. The Japanese Patent Publication of Unexamined Application proposes to start the non-linear coefficient calculation upon completion of the x-ray crystal structure. Thus, the different jobs are respectively assigned to the data processing units, and a master-slave relation is established in the data processing units.

Yet another related prior art is disclosed in Japanese Patent Publication of Unexamined Application No. 60-134370. The Japanese Patent Publication of Unexamined application discloses a distributed data processing system. The distributed data processing system includes a plurality of computers or terminals and a job assignor connected through a communicating network. When the job assignor receives a request for a file or a program, the job assignor calculates a data processing cost, a communication cost and job waiting time for each of the computers, and selects a computer which minimizes a function having the data processing cost, the communication cost and the waiting time as parameters.

Still another related prior art is disclosed in Japanese Patent Publication of Examined Application No. 2-30534. The prior art distributed data processing system disclosed therein averages the jobs and minimizes the waiting time. The Japanese Patent Publication of Examined Application describes a data processing system which moves a job request along a path established therein, and assigns the jot to the first computer available for the data processing. The Japanese Patent Publication of Examined Application points out that the job assignment, i.e., the movement of job request along the path makes the throughput low due to uneven job assignment. The Japanese Patent Publication of Examined Application proposes the distributed data processing system as a solution of the low throughput.

Japanese Patent Publication of Unexamined Application No. 7-72206 discloses an LSI (Large Scale Integration) inspection apparatus, and the present inventor participates the disclosed invention as one of the co-inventors. The prior art LSI inspection apparatus includes a memory tester and a personal computer storing pieces of expert know-now of a process engineer, a circuit engineer and a layout engineer. The prior art LSI inspection apparatus selectively activates the pieces of expert know-how, and the personal computer gives instructions to the memory tester as if the engineers talk with it. When the personal computer receives pieces of bit map information indicative of a test result from the memory tester, the personal computer firstly activates the main expert so as to categorizes the pieces of bit map information, and selects a sub-expert so as to automatically locate a source of trouble. The sources of trouble are statistically processed so as to analyze the origin of the trouble.

The analysis consumes long time period, and this is common to the prior art failure analyzers. Assuming now that a disconnection takes place in a wiring due to a contaminant on a semiconductor wafer, the disconnected wiring makes all of the memory cells provided on the downstream side of the disconnection defective, and the prior art failure analyzer is expected to analyze all the memory cells fabricated on the silicon wafer. The analysis consumes long time. The memory cells are increased together with the data storage capacity of the semiconductor memory cells. In case of 256 mega-bit dynamic random access memory device, the memory cells are $2^{28}$. When the manufacturer fabricates the dynamic random access memory device on 8-inch silicon wafer, a hundred dynamic random access memory devices are arranged on the silicon wafer. If the prior art failure analyzer is expected to analyze to silicon wafers, the memory cells to be analyzed are $2^{28} \times 100 \times 10 = 268,435,456,000$. The prior art failure analyzer imparts an identity code representative of a kind of defect, a coordinate data code representative of the coordinates of a die on the silicon wafer, a coordinate data code representative of the coordinates of the defective memory cell in the memory device, a dimensional data code representative of the dimensions of the defect and a characteristic data code representative of the particular feature of the defect to each memory cell, and the data codes for each memory cell consume more than ten bytes. For this reason, 2,684,354,560,000 bytes are newly required for every day, and the total amount of analysis data reaches the limit of the data storage manageable by a single computer.

Adventist Corporation, which is a Japanese manufacturing company, proposes a data compression technology for the failure analyzer. The defective cells are categorized in groups such as a block defect, a line defect, a crossing defect between wirings, a pair defect representative of adjacent two defective cells and a single cell defect. However, there is no category for adjacent three defective cells. The cell group does not mean any electric block, and the defect origin is hardly specified. Moreover, if the cell group is further divided into cell sub-groups such as three defect cells, four defect cells, five defect cells, . . . n defect cells, the groups are increased, and the prior art failure analyzer consumes long time for categorization and analysis. Even if a high-speed data processor is installed in the prior art failure analyzer, the high-speed data processor would become obsolescent in the next generation. Moreover, the high-speed data processor is expensive. Thus, the prior art failure analyzer suffers from a large amount of data to be analyzed.

SUMMARY OF THE INVENTION

It is therefore an important object of the present invention to provide a failure analyzer which economically copes with the increase of data to be analyzed.

It is also an important object of the present invention to provide a method of failure analysis used in the failure analyzer.

To accomplish the objects, the present invention proposes to employ a client-server network technology in a failure analyzer.

In accordance with one aspect of the present invention, there is provided a failure analyzer for analyzing pieces of test data information having pieces of appearance test data information and pieces of electric test data information, comprising a test system including a visual inspection sub-system carrying out an appearance test for a semiconductor wafer so as to produce the pieces of appearance test data information and an electric characteristic inspection sub-system carrying out electric tests for integrated circuit devices fabricated on the semiconductor wafer for producing the pieces of electric test data information, and a data analyzing system connected to the test system for analyzing the pieces of test data information, and implemented by using a client-server network technology.

In accordance with another aspect of the present invention, there is provided a method for analyzing pieces of data information obtained from an integrated circuit fabricated on a semiconductor wafer comprising the steps of a) carrying out electric tests for electric components of the integrated circuit and an appearance test for an area of the semiconductor wafer so as to produce pieces of electric test data information each representative of a diagnosis of one of the electric components and a piece of appearance test data information representative of a diagnosis of the area, and b) making the pieces of electric test data information representative of a certain diagnosis depending upon the tendency of the diagnosis of the electric elements.

BRIEF DESCRIPTION OF THE DRAWINGS

The features and advantages of the failure analyzer and the method used therein will be more clearly understood from the following description taken in conjunction with the accompanying drawings in which.

DESCRIPTION OF THE PREFERRED EMBODIMENT

In the following description, term "coordinate overlay tolerance" means an allowable error between coordinates assigned to a defect through a certain inspection and coordinates assigned to the defect through another inspection. Even if two sets of coordinates have a difference within the coordinate overlay tolerance, a failure analyzer decides the defect specified through one inspection to be identical with the defect specified through another inspection.

The failure analyzer embodying the present invention largely comprises a data output apparatus 1, a test system 2 for a semiconductor integrated circuit device and a data analyzing system 3 connected to the data output apparatus 1 and the test system 2. The data output apparatus 1 provides an interface between operator/analyzer and the data analyzing system 3, and the test system 2 carries out electric tests and a visual inspection or an appearance test. In this instance, the data analyzing system 3 is implemented by a client-server network. Terminal computer units, which serve as local analyzers, and associated data memories form parts of the client-server network, and are increasable depending upon the amount of data to be analyzed. For this reason, even if a semiconductor manufacturer increases the integration density of a semiconductor integrated circuit device, the manufacturer copes with the increase of data to be analyzed by adding a terminal computer unit, and the failure analyzer according to the present invention does not become obsolescent.

Figure 1:
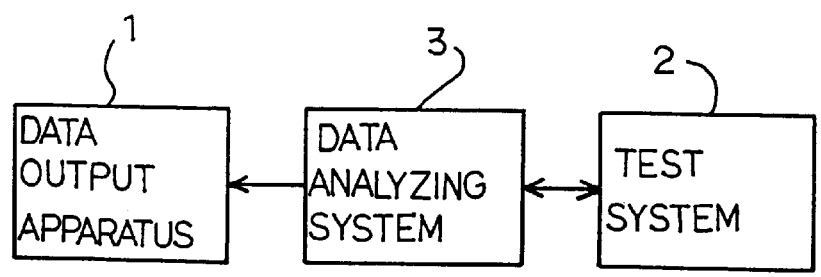
FIG. 1 is a block diagram showing the arrangement of a failure analyzer according to the present invention.
Figure 2:
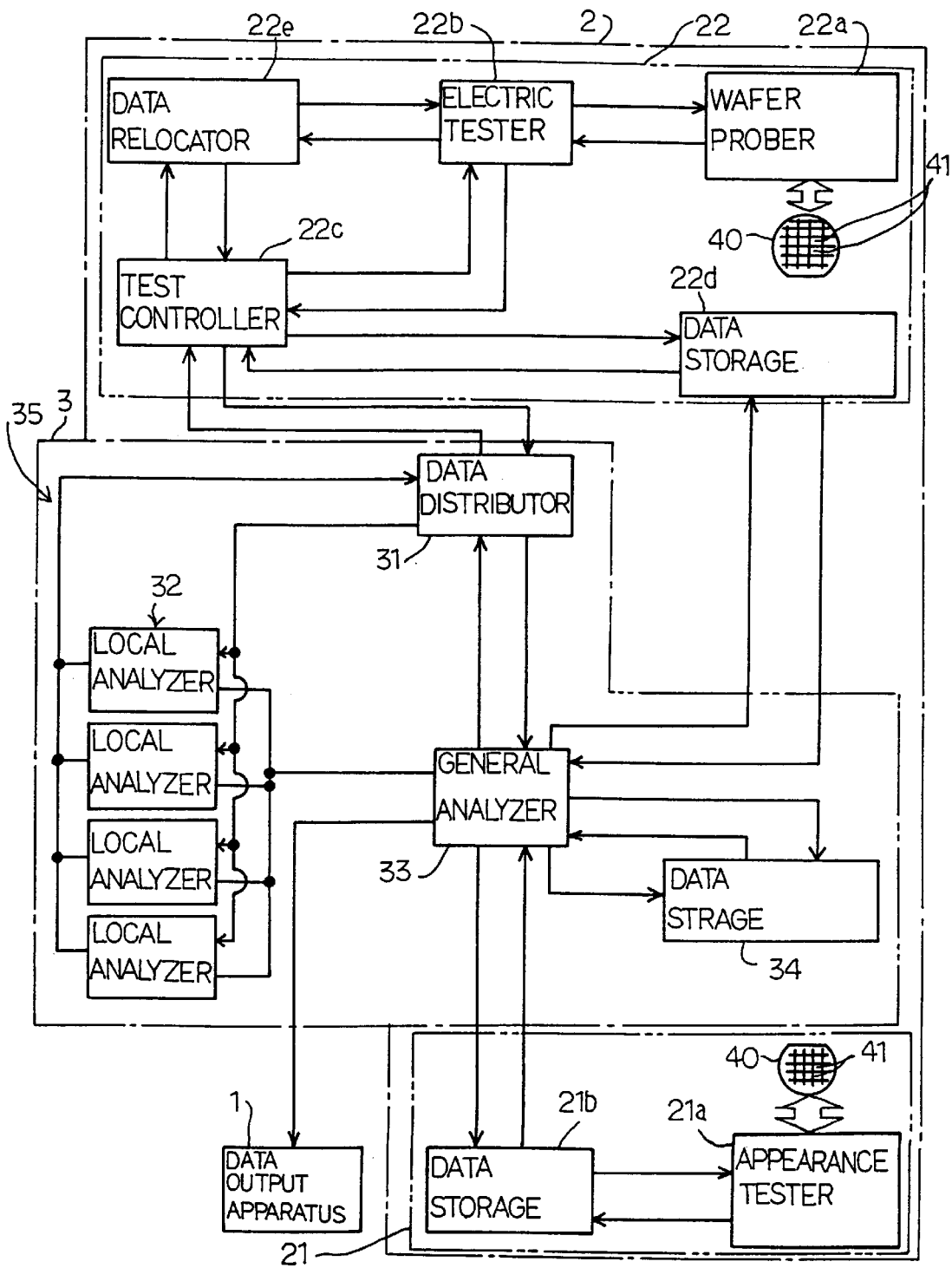
FIG. 2 is a block diagram showing the arrangement of a test system, a server-client system and a data output apparatus forming parts of the failure analyzer.

FIG. 2 illustrates the arrangement of the test system 2 and the arrangement of the data analyzing system 3 together with the data output apparatus 1.

The test system 2 is broken down into a visual inspection sub-system 21 and a characteristic inspection sub-system 22. The visual inspection sub-system carries out a visual inspection or an appearance test for a semiconductor wafer 40 where a plurality of integrated circuit devices 41 such as, for example, a dynamic random access memory device are fabricated. The characteristic inspection sub-system 22 electrically checks the integrated circuit device 41 to see whether it contains a defective circuit component such as a memory cell.

A large number of defects are resulted from a contaminant, a disfigurement and a pattern defect. If the contaminant, the disfigurement or the pattern defect damages an integrated circuit, it is difficult for the failure analyzer to identify the cause of the damage through electric tests. However, the defects are easily found through the visual inspection.

The visual inspection sub-system 21 includes an appearance tester 21a and a data storage 21b. The data storage 21b has a memory area assigned to pieces of area data information and another memory area assigned to pieces of appearance test data information. The piece of area data information is indicative of an area to be inspected by the appearance tester 21a, and the piece of appearance test data information represents test results of the visual inspection carried out for a semiconductor wafer 40. The pieces of area data information are supplied from the data analyzing system 3 to the data storage 21b, and the pieces of appearance test data information are supplied from the appearance tester 21a to the data storage 21b.

A data processor (not shown), a suitable position aligner (not shown) and an optical inspector (not shown) are incorporated in the appearance tester 21a. The data processor fetches a piece of area data information, and causes the position aligner to align a target area of the semiconductor wafer 40 with the optical inspector. The optical inspector digitizes an visual image from the target area, and the data processor checks the digital data representative of the visual image to see whether or not a pattern defect and/or a contaminant is found in the target area. The data processor produces the test results into a piece of appearance test data information, and supplies the piece of appearance test data information to the data storage 21b. The pieces of appearance test data information form an appearance test database.

The characteristic inspection sub-system 22 carries out various electric tests for the integrated circuits 41, and requests data analysis to the data analyzing system 3. The characteristic inspection sub-system 22 includes a wafer prober 22a, an electric tester 22b, a test controller 22c, a data storage 22d and a data relocator 22e.

The wafer prober 22a has a probe card (not shown) connectable to signal pads of the integrated circuit device, and the wafer prober 22a brings the probe card into contact with the signal pads of the integrated circuit device fabricated on the semiconductor wafer 40. The electric tester 22b supplies a test bit pattern through the wafer prober 22a to the integrated circuit device, and the wafer prober 22a transfers an output signal pattern from the integrated circuit device to the electric tester 22b.

The data storage 22d stores pieces of design data information representative of a circuit layout, mask patterns, a circuit configuration and so forth for various integrated circuit devices, and the pieces of design data information form a design database.

The test controller 22c is connected to the data analyzing system 3, and the data analyzing system 3 specifies a kind of integrated circuit to be tested and analysis conditions. The test controller 22c supplies a request for data transfer to the data storage 22d so as to read out pieces of design data information for the integrated circuit device to be tested. The test controller 22c determines a test sequence on the basis of the pieces of design data information. The test controller 22c supplies a piece of first control data information to the electric tester 22b so as to inform the electric tester of the test sequence. The electric tester 22b to sequentially carry out the electric tests as follows.

The electric tester 22b produces the test bit pattern for each electric test, and supplies the test bit pattern to the wafer prober 22a as described hereinbefore. When the wafer prober 22a transfers the output signal pattern to the electric tester 22b, the electric tester 22b compares the output signal pattern with an expected signal pattern of each electric test to see whether or not there is a difference. In this way, the electric tester 22b diagnoses the integrated circuit device, and stores test results representative of defects in a built-in memory. The electric tester 22b supplies pieces of first data information representative of the original test results to the test controller 22c.

When the test controller 22c receives the pieces of first test data information, the test controller 22c checks the original test results to see whether or not the test sequence is still appropriate. If the test sequence is still appropriate, the test controller allows the electric tester 22b to continue the remaining electric tests. However, if not, the test controller 22c modifies the test sequence in such a manner as to focus the electric tests on a defective circuit of the integrated circuit device, and supplies another piece of first control data information representative of the modified test sequence to the electric tester 22b. With the modified test sequence, the electric tester 22b changes the order of electric tests. In this way, the test controller 22c cooperates with the electric tester 22b, and specifies the defective circuit.

The data relocator 22e also cooperates with the test controller 22c, and relocates the original test results in conformity with the circuit layout, thereby making the test results visually understandable. The test controller 22c can specify a defective circuit through the electric tests. However, the test controller 22c can not specify the position of a defect. The test controller 22c determines conditions for a data relocation on the basis of the pieces of design data information, and supplies pieces of second control data information representative of the conditions to the data relocator 22e. The data relocator 22e requests the electric tester 22b to supply the pieces of first test data information representative of the original test results, and the electric tester 22b supplies the pieces of first test data information to the data relocator 22e. The data relocator 22e rearranges the original test results in conformity with the circuit layout, and supplies pieces of second test data information representative of rearranged test results to the test controller 22c. The test controller 22c compares the rearranged test results with the original test results and the pieces of design data information, and assumes a cause of defect. However, the analysis is simple, and a high-level analysis is carried out by the data analyzing system 3.

The data analyzing system 3 includes a data distributor 31, a plurality of local analyzers 32, a general analyzer 33 and a data storage 34. The data distributor 31, the local analyzers 32 and the general analyzer 33 are connected to one another through a communicating network 35.

The data storage 34 stores pieces of precedent data information representative of typical examples of dependency of appearance defect on electrical defects, and the pieces of precedent data information form a precedent data base. The general analyzer 33 is connected to the data storage 34. The general analyzer 33 selectively reads out the pieces of precedent data information from the data storage 34, and adds a pieces of precedent data information representative of a new example to the precedent database. The general analyzer 33 is further connected to the data storage 22d, and reads of the pieces of design data information from the data storage 22d.

The data distributor 31 is connected to the test controller 22c, the local analyzers 32 and the general analyzer 33 through the communication network 35. The general analyzer 33 specifies a kind of integrated circuit device to be tested and the analysis conditions. The general analyzer 33 supplies pieces of third control data information representative of the kind of integrated circuit and the analysis conditions to the data distributor 31, and the data distributor 31 transfers the pieces of third control data information to the test controller 22c. The behavior of the test controller 22c is described hereinlater.

When the data relocator 22e supplies the pieces of second test data information representative of the rearranged test results to the test controller 22c, the test controller 22c transfers the pieces of second test data information to the data distributor 31, and data distributor 31 supplies a piece of fourth control data information representative of a request for resource data information to the local analyzers 32. The local analyzers 32 supplies pieces of resource data information representative of current status to the data distributor 31, and data distributor 31 appropriately divide the second test data information into data groups. The data distributor 31 divides the rearranged test results into data groups by a reticle mask, semiconductor chip or circuit block of each semiconductor chip in accordance with instructions of the general analyzer 33. The data distributor 31 produces pieces of third test data information from the pieces of second test data information representative of the rearranged electric test results and other pieces of test/analysis data information, and distributes the pieces of third test data information to the local analyzers 32. When the general analyzer 33 supplies a request for data transfer, the data distributor 31 transfers the pieces of second test data information thereto.

The local analyzers 32 analyze the given pieces of third test data information, respectively, and produce pieces of local analysis data information representative of the analysis result. Upon completion of the local analysis, the local analyzer 32 supplies the piece of local analysis data information to the general analyzer 33 and a piece of fifth control data information representative of the completion of the analysis to the data distributor 31.

When the general analyzer 33 receives the pieces of local analysis data information from the local analyzers 32, the general analyzer 33 carries out a general analysis for each semiconductor wafer 40, and produces a piece of general analysis data information. The general analyzer 33 instructs the visual tester to carry out the appearance test, and takes a piece of appearance test data information into account so as to determine a failure analysis report for the semiconductor wafer. The general analyzer 33 produces a pieces of failure analysis report information representative of the failure analysis report, and supplies the pieces of failure analysis report information to the data output apparatus 1. The data output apparatus 1 indicates the failure analysis report for the semiconductor wafer 40.

While the general analyzer 33 is determining the failure analysis report, the general analyzer 33 superposes the general analysis result on the appearance test result, and investigates the dependency of the appearance defect on the electric defects. The general analyzer 33 supplies a request for data transfer to the data storage 34 so as to read out the pieces of precedent data information, and checks the pieces of precedent data information to see whether or not the dependency is new. When the dependency is confirmed to be new, the general analyzer 33 produces a piece of precedent data information representative of the new dependency, and stores the piece of precedent data information in the precedent database.

The general analyzer 33 further produces the piece of area data information, and supplies the pieces of area data information to the data storage 21b.

The general analyzer 33 further reads out the pieces of design data information of the kind of integrated circuit device from the data storage 22d, and carries out a collation between the pieces of design data information and the pieces of second test data information to see whether there is a conflict therebetween. If a conflict is find, the general analyzer corrects the data information.

Figure 3A:
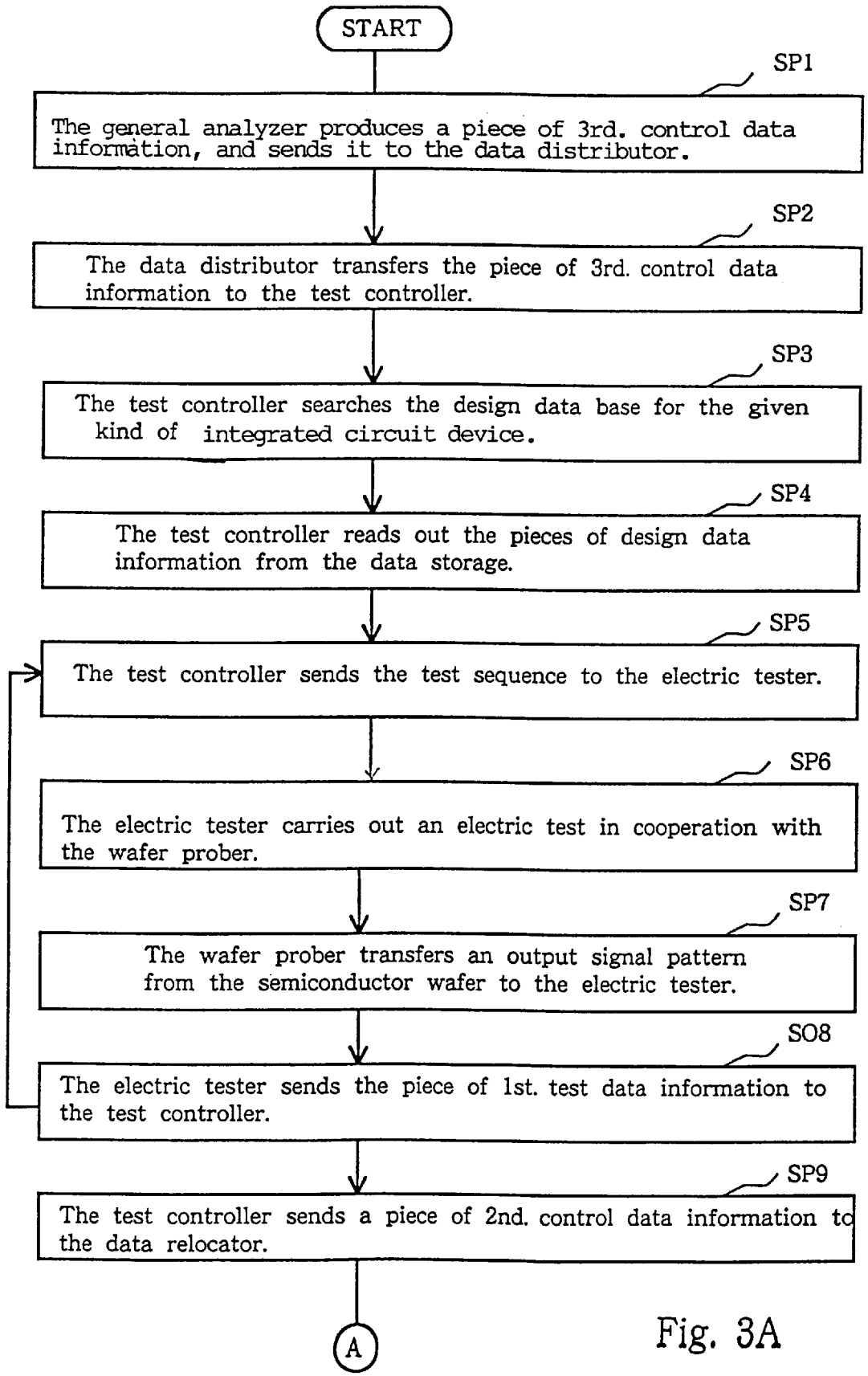
FIGS. 3A to 3C are flowcharts showing a failure analysis according to the present invention.
Figure 3B:
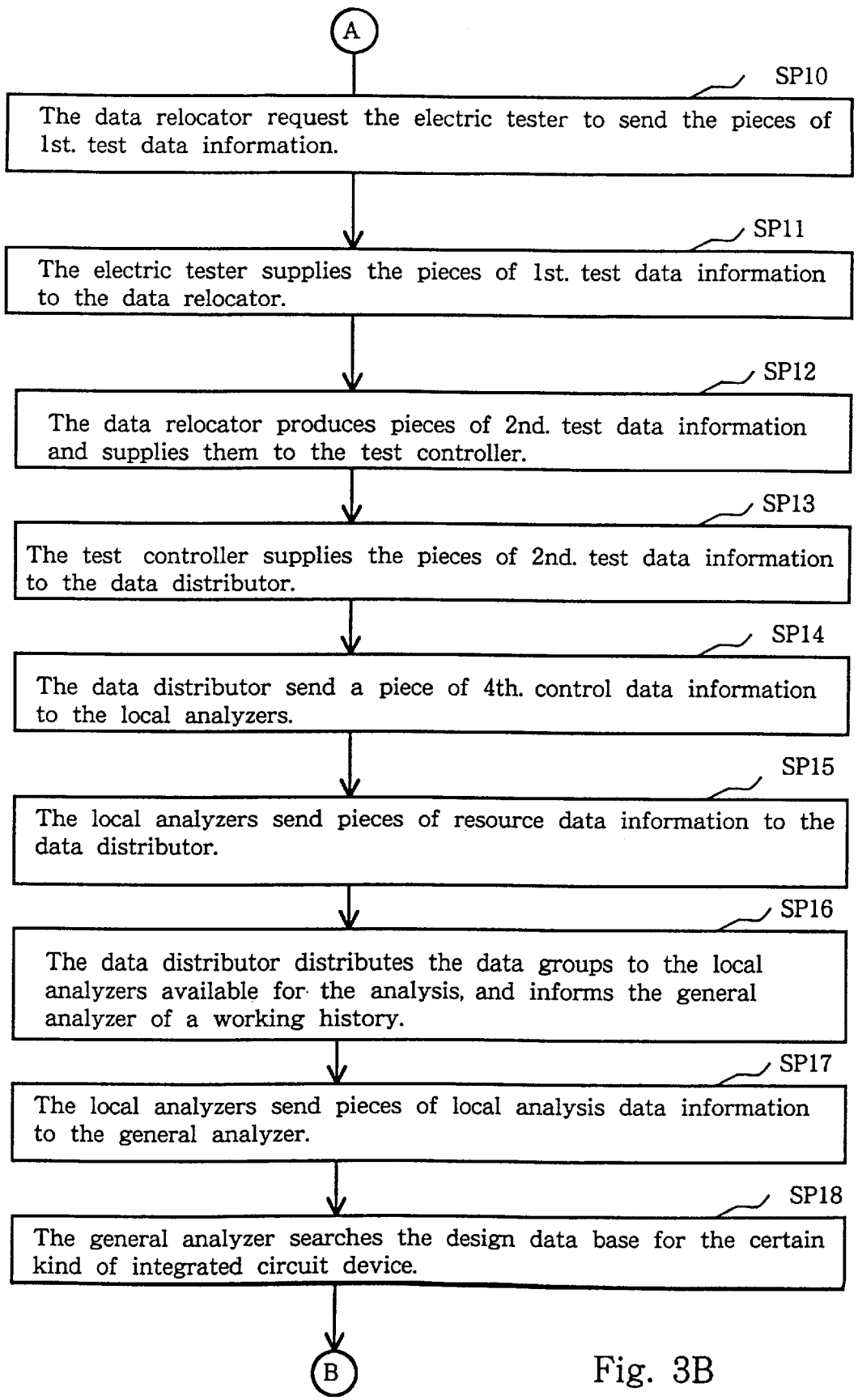
Figure 3C:
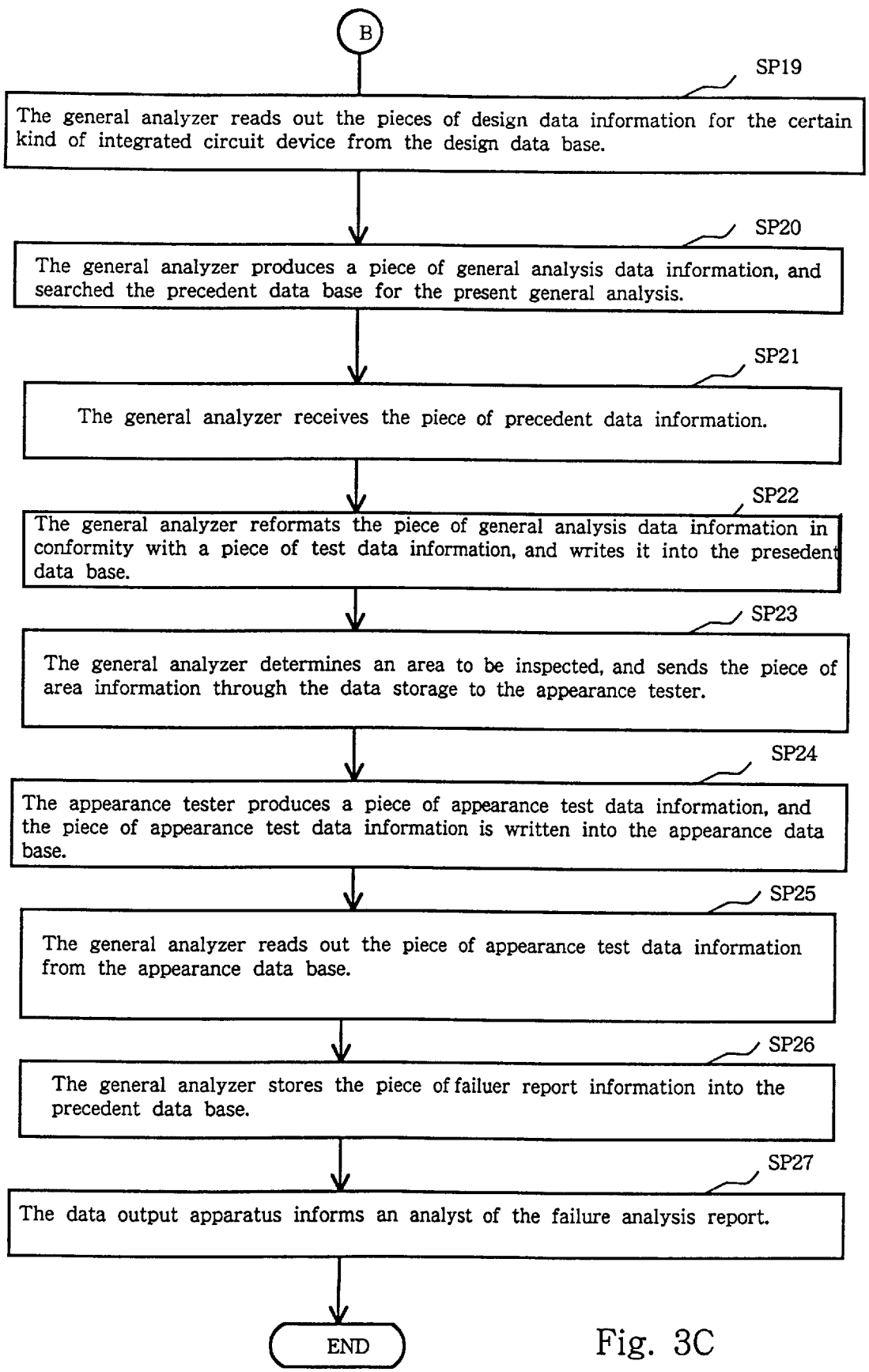

Description is hereinbelow made on the behavior of the failure analyzer according to the present invention with reference to FIGS. 3A to 3C. When an analyst instructs the failure analyzer according to the present invention to start an analysis for a certain kind of integrated circuit device, the general analyzer 33 produces a piece of third control data information representative of the certain kind of integrated circuit device and standard analysis conditions, and sends the piece of third control data information to the data distributor 31 as by step SP1. If the analyst requires additional analysis for the certain kind of integrated circuit device, the analysis gives the additional analysis conditions to the general analyzer 31, and the piece of third control data information further represents the additional analysis conditions.

The data distributor 31 transfers the piece of third control data information to the test controller 22c as by step SP2. If the object of the analysis is frequently changed or the analysis conditions are irregular, the data distributor 31 modifies the piece of third control data information. For example, when the appearance test is intermittently carried out over a semiconductor wafer 40, the electric tester 22b is expected to carry out the electric test for the selected semiconductor chips 41, and the data distributor 31 modifies the piece of third control data information.

When the piece of third control data information reaches the test controller 22c, the test controller 22c searches the design data base for the given kind of integrated circuit device as by step SP3, and reads out the pieces of design data information from the data storage 22d as by step SP4.

The test controller 22c analyzes the pieces of design data information, and determines a test sequence, conditions for relocation and conditions for assigning coordinates on the wafer to a defect. The test sequence and these conditions are different between the kinds of integrated circuit device, and the test controller 22c requires the pieces of design data information. The test controller 22c sends the test sequence to the electric tester 22b as by step SP5.

The electric tester 22b produces a test bit pattern for the first electric test specified by the test sequence, and supplies the test bit pattern to the wafer prober 22a. The wafer prober 22a applies the test bit pattern to the signal pads on the semiconductor wafer 40, and the integrated circuit produces output signals. Thus, the electric tester 22b carries out the electric test in cooperation with the wafer prober 22a as by step SP6. The wafer prober 22a transfers the output signal pattern from the signal pads to the electric tester 22b as by step SP7.

The electric tester 22b compares the output signal pattern with the expected signal pattern to see whether or not there is a discrepancy. The electric tester 22b picks up the differences, and produces a piece of first test data information. The electric tester 22b sends the piece of first test data information to the test controller 22c as by step SP8.

The test controller 22c arranges electric tests in such a manner as to specify a cause of defect. When the test controller 22c receives the piece of first test data information representative of the test results, the test controller 22c analyzes the test results by using the pieces of design data information to see whether or not the test sequence is suitable for the trouble shooting. If the test controller 22c decides the present test sequence to be inappropriate, the test controller 22c modifies the test sequence depending upon the test results, and informs the electric tester 22b of the new test sequence as indicated by an arrow from step SP8 to step SP5. With the new test sequence, the electric tester 22b further carries out the electric test, and produces a piece of first test data information. Thus, the test controller 22c and the electric tester 22b repeat steps SP5, SP6, SP7 and SP8 until all the electric tests are carried out.

Subsequently, the test controller 22c sends the piece of second control data information representative of the conditions for data relocation to the data relocator 22e as by step SP9. The data relocator 22e sends the request for data transfer to the electric tester 22b as by step SP10, and the electric tester 22b supplies the pieces of first test data information to the data relocator 22e as by step SP11.

The data relocator 22e rearranges the test results in conformity with the circuit arrangement, and produces pieces of second test data information representative of the rearranged test results. The data relocator 22e supplies the pieces of second test data information to the test controller 22c as by step SP12. The test controller 22c carries out a simple analysis on the test results.

The test controller 22c supplies the pieces of second test data information representative of the rearranged test results to the data distributor 31 as by step SP13, and starts the electric tests for another semiconductor wafer 40.

The data distributor 31 sends a piece of fourth control data information representative of the distribution of the pieces of second test data information to the local analyzers 32 as by step SP14. The local analyzers 32 send pieces of resource data information representative of the current status to the data distributor 31 as by step SP15. The data distributor 31 checks the pieces of resource data information to see what local analyzer is available for the analysis, and selects local analyzers 32 available for the analysis. The data distributor 31 divides the pieces of second test data information into a plurality of data groups, and sends the data groups to the selected local analyzers 32.

The data distributor 31 divides the pieces of second data information into the gate groups as follows. The integrated circuit device is assumed to be a 256 mega-bit dynamic random access memory device. If a local analyzer 32 can process a large amount of data, the data distributor 31 cuts a large piece from the second test data information, and supplies the large piece of second test data information to the local analyzer 32. The large piece of second test data information may be corresponding to a pattern transferred from a reticle mask or the integrated memory circuit fabricated on a semiconductor chip. The reticle mask is constituted by 2–4 masks, and the pattern of the reticle mask is transferred onto the semiconductor wafer 40 through a single exposure. On the other hand, if a local analyzer 32 merely processes a small amount of data, the data distributor 31 cuts a small piece from the second test data information, and supplies the small piece of second test data information to the local analyzer 32. The small piece of second test data information may be corresponding to a part of the integrated memory circuit fabricated on the semiconductor chip such as, for example, 16 mega-bit memory cell sub-array. In this way, the data distributor averages the load between the local analyzers 32.

The data distributor 31 produces a piece of management data information representative of a working history, and sends the piece of management data information to the general analyzer 33. Thus, the data distributor 31 stands between the local analyzers 32 and the general analyzer 33, and promotes the local analysis as by step SP16.

The local analyzers 32 carries out the local analysis, and produces pieces of local analysis data information representative of the high-level local analysis results. The local analyzers 32 send the pieces of local analysis data information to the general analyzer 33 as by step SP17.

The general analyzer 33 searches the design data base for the certain kind of integrated circuit device as by step SP18 so as to read out the pieces of design data information for the certain kind of integrated circuit device from the data storage 22d as by step SP19. The general analyzer 33 checks the pieces of design data information, and assembles the pieces of local analysis data information into a piece of general analysis data information representative of the general analysis results on the semiconductor wafer level.

The general analyzer 33 searches the precedent database for the general analysis results as by step SP20. If there is a precedent, the piece of precedent data information is sent from the data storage 34 to the general analyzer 33, and the general analyzer 33 receives the piece of precedent data information as by step SP21. The general analyzer 33 reformats the piece of general analysis data information in conformity with a piece of appearance test data information, and the general analyzer 33 sends the piece of general analysis data information so as to write it into the precedent data base as by step SP22.

The general analyzer 33 determines an area to be inspected on the basis of the piece of general analysis data information reformatted in conformity with a piece of appearance test data information, and produces a piece of area data information. The general analyzer 33 sends the piece of area data information to the data storage 21b, and the appearance tester 21a fetches the piece of area data information as by step SP23.

The appearance tester 21a carries out the appearance test for the area corresponding to the piece of area data information, and produces a piece of appearance test data information. The piece of appearance data information is written into the appearance test data base in the data storage 21 as by step SP24, and the general analyzer 33 reads out the piece of appearance data information as by step SP25.

The general analyzer superposes the piece of appearance data information on the piece of general analysis data information, and diagnoses the semiconductor wafer 40 so as to determine a dependency of the electric test results and the appearance test results. The general analyzer 33 writes the dependency into a piece of failure analysis report information, and stores it into the precedent data base as by step SP26.

Finally, the general analyzer 33 sends the piece of failure analysis report information to the data output apparatus 1, and the data output apparatus 1 informs the analyst of the failure analysis report as by step SP27.

If the certain kind of integrated circuit device is a memory, the electric tests and the local analysis are carried out for each of the memory cells. However, the coordinate overlay tolerance sets limit on the area to be inspected by the appearance tester 21a, and the narrowest area is corresponding to some memory cells. For this reason, the failure analysis is carried out for each area inspected by the appearance tester 21a. If a group of memory cells is the cause of trouble, the electric tests hardly specify the cause. The amount of electric test results for the group of memory cells are usually large, and the analysis consumes long time period. In this instance, the area for the appearance test is matched with the group of memory cells by appropriately regulating the coordinate overlay tolerance. The data size or the amount of electric data is shrunk, the load of analyzing system is decreased, and the analysis speed is improved.

Figure 4A:
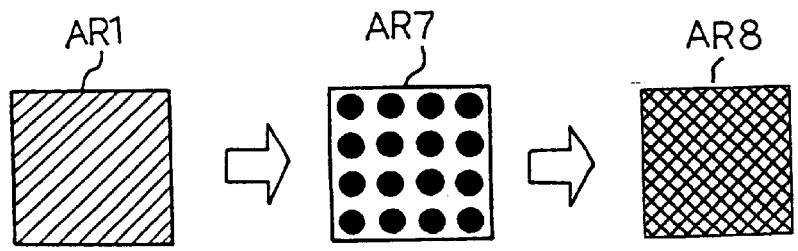
FIG. 4A is a view showing a failure analysis carried out by the failure analyzer according to the present invention.
Figure 4B:
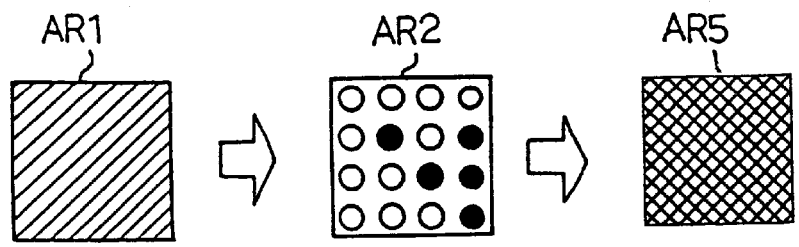
FIGS. 4B and 4C are views showing a failure analysis carried out by the prior art failure analyzer.
Figure 4C:
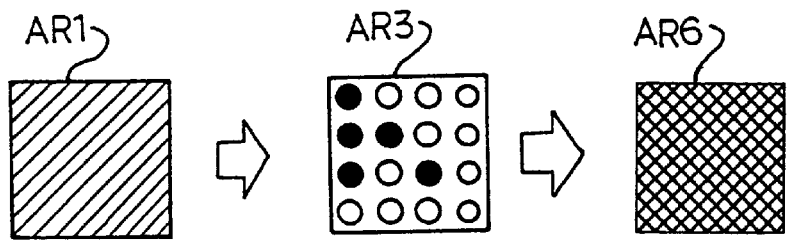

Assuming now that the area for the appearance testis indicated by hatched square AR1 (see FIGS. 4A to 4C), sixteen memory cells are formed in the area AR1. The electric tests indicate that non-defective memory cell and defective memory cells are mixed in the area AR1. Dots represent the defective memory cells, and bubbles represent the non-defective memory cells. The prior art failure analyzer diagnoses the individual memory cells as indicated by AR2/AR3, and takes the appearance test result into account. The prior art failure analyzer totally diagnoses the area AR1 to be defective as indicated by AR5/AR6. On the other hand, when a certain number of defective memory cells are found in the area AR1, the failure analyzer according to the present invention assumes all the memory cells to be defective as indicated by AR7, and totally diagnoses the area AR1 to be defective as indicated by AR8. The certain number is a threshold of the assumption, and may be four for the area corresponding to sixteen memory cells. Thus, the failure analyzer according to the present invention introduces the assumption into the general analysis, and decreases the amount of electric test data.

The local analyzers 32 are expected to analyze the pieces of second data information distributed through the communicating network, and the analysis to be carried out is different between the local analyzers 32 depending upon the instructions from the general analyzer 33 and the given pieces of second test data information. The general analyzer 33 may instruct the data distributor 31 to add a piece of appearance test data information, pieces of general analysis data information of another semiconductor wafer, pieces of general analysis data information of another semiconductor chip on the same semiconductor wafer 40 or a piece of local analysis data information of another block on the same semiconductor chip 41 to the piece of second test data information.

If a piece of appearance test data information is added to the piece of second test data information, the local analyzer 32 superposes the piece of appearance test data information on the piece of second test data information. If pieces of general analysis data information of another semiconductor wafer are added, the local analyzer 32 carries out an analysis between the semiconductor wafers as if the semiconductor wafers are overlapped with one another. If the pieces of local analysis information of another semiconductor chip 41 on the same semiconductor wafer 40 are added, the local analyzer 32 carries out an analysis between the semiconductor chips 41 on the same semiconductor wafer 40 as if the semiconductor chips 41 are overlapped with one another. If the pieces of local analysis data information of another block are added, the local analyzer 32 carries out an analysis between the blocks as if the blocks are overlapped with one another.

Subsequently, a trend analysis on semiconductor wafer is described. The trend analysis on semiconductor wafer is incorporated in the local analysis, and the trend analysis result forms a part of the piece of local analysis data information sent to the general analyzer 33 at step SP17. For example, the local analyze checks the pieces of second test data information to see whether or not a defect repeatedly takes place at a certain position on semiconductor wafers. The local analyzer 32 superposes a pattern of data indicative of defects for a semiconductor chip with a pattern or data indicative of defects for another semiconductor chip, and checks the data to see whether or not the coordinates of the defect are matched with one another. If matched, the local analyzer 32 determines a distribution of the defect on the semiconductor wafer, and checks the distribution to see whether or not the defect tends to take place at a certain position.

In the prior art failure analyzer, the trend analysis is carried out by an analyzer corresponding to the general analyzer 33, and increases the load of the analyzer. On the other hand, the failure analyzer according to the present invention assigns coordinates on a semiconductor wafer to each electric defect, and instructs the local analyzers 32 to check the electric defects to see whether the electric defects are concentrated in a central area or a peripheral area or arranged on a radial line or an oblique line. Thus, the failure analyzer according to the present invention carries out a high-level analysis on the semiconductor wafer level in cooperation between the local analyzers 32 and the general analyzer 33.

Figure 5:
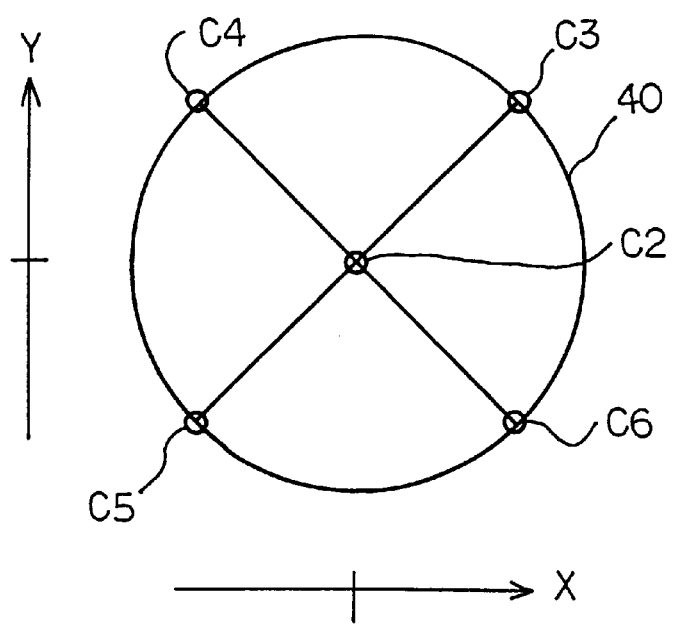
FIG. 5 is a view showing semiconductor chips on a semiconductor wafer subjected to a trend analysis.

FIG. 5 illustrates an example of the trend analysis on semiconductor wafer. The coordinate system X-Y are established in the local analyzers 32, and coordinates are given to a memory chip C2 at a center of the semiconductor wafer 40 and memory chips C3 to C6 equally spaced from the center of the semiconductor wafer 40. The local analyzers 32 compares the memory chips C3 to C6 with the memory chip C2 to see whether or not the defects are matched with one another. If the defects are matched, the local analyzers 32 supplies the pieces of local analysis data information representative of the defect matched therewith to the general analyzer 33, and the general analyzer 33 assembles the pieces of local analysis data information to see whether or not there is a tendency. In this way, the local analyzers 32 decrease the load of the general analyzer 33 in the trend analysis, and the data analyzing system completes the trend analysis within short time period.

The memory chips C3/C4 are point symmetry with the memory chips C5/C6. The memory chips C3/C6 are identical in y-coordinate with the memory chips C4/C5, and the memory chips C3/C4 are identical in x-coordinate with the memory chips C6/C5. In this situation, the defect distribution of one semiconductor chip tends to be similar to the defect distribution of the other semiconductor chip. The general analyzer 33 instructs the local analyzers 32 to check the semiconductor chips in one of the above relations to see whether or not the defective distribution of one semiconductor chip is matched with the defective distribution of the other semiconductor chip.

The local analyzer 32 is implemented by a personal computer with a large main memory and a large hard disk unit. Personal computers are usually assigned to analysts of a semiconductor manufacturer. While the analysts do not use the personal computers, the personal computers are available for the local analysis.

A personal computer presently available has 256 megabyte main memory and 16 giga-byte hard disk. When 1024 personal computers are connected through the communication network 35, the total capacity of the main memories is 256 giga-bytes, and the total capacity of the hard disks is 16 tera-bytes.

Suitable server computers serve as the data distributor 31 and the general analyzer 33, respectively, and the data transfer directions are preferably arranged in the data analyzing system 3. This results in reduction of load of each server computer.

The data output apparatus 1 is implemented by a printer. If the failure analyzer according to the present invention starts to analyze the semiconductor wafer after analyst return home, the failure analyzer completes the failure analysis report for ten semiconductor wafers 40, and the data output apparatus 1 prints out the failure analysis report until the next morning.

The manufacturer diverts the data storage for the appearance data base, the appearance tester, the precedent data base stored in the data storage, the design data base stored in the data storage, the wafer prober, the electric tester, the data relocator and the test controller of the prior art failure analyzer to the failure analysis according to the present invention. The data relocator 22e and the test controller 22c are obtainable from the market. If the amount of data to be analyzed is relatively small, these standard apparatus may be used without remodeling.

As will be appreciated from the foregoing description, the data analyzing system 3 is implemented by using the client-server network technology, and the local analyzers are increasable. For this reason, the failure analyzer according to the present invention is flexible, and easily copes with development of integration density.

Personal computers already installed in the facility are available for the data analyzing system 3, and the failure analyzer according to the present invention is economical.

The electric test results are simplified by using the coordinate overlay tolerance for the appearance test. As a result, the amount of data to be analyzed is decreased, and the failure analyzer completes the analysis within short time period. For example, when the memory cell size G1 is 0.1 micron and the coordinate overlay tolerance for the appearance test is 1 micron, the amount of test data for the memory cell group is reduced to 1/100 without undesirable influence on the precision of the appearance test.

Although a particular embodiment of the present invention has been shown and described, it will be obvious to those skilled in the art that various changes and modifications may be made without departing from the spirit and scope of the present invention.

What is claimed is:

1. A failure analyzer for analyzing pieces of test data information having pieces of appearance test data information and pieces of electric test data information, comprising:
    a test system including a visual inspection sub-system carrying out an appearance test for a semiconductor wafer so as to produce said pieces of appearance test data information, and an electric characteristic inspection sub-system carrying out electric tests for integrated circuit devices fabricated on said semiconductor wafer for producing said pieces of electric test data information; and
    a data analyzing system connected to said test system for analyzing said pieces of test data information, and implemented by using a client-server network technology.

2. The failure analyzer as set forth in claim 1, in which said data analyzing system includes
    a general analyzer producing a piece of failure analysis report information from pieces of local analysis data information,
    a plurality of local analyzers for producing said pieces of local analysis data information,
    a data distributor distributing said pieces of test data information to said plurality of local analysis data information, and
    a communicating network connected between said general analyzer, said plurality of local analyzers and said data distributor.

3. The failure analyzer as set forth in claim 2, in which said data distributor produces a small piece of test data information for one of said plurality of local analyzers with a small data processing capability and a large piece of test data information for another of said plurality of local analyzer with a large data processing capability.

4. The failure analyzer as set forth in claim 2, in which the number of said plurality of local analyzers is changeable.

5. A method for analyzing pieces of data information obtained from an integrated circuit fabricated on a semiconductor wafer, comprising the steps of:
    a) carrying out electric tests for electric components of said integrated circuit and an appearance test for an area of said semiconductor wafer so as to produce pieces of electric test data information each representative of a first diagnosis or a second diagnosis of one of said electric components and a piece of appearance test data information representative of a diagnosis of said area, and
    b) making said pieces of electric test data information representative of either first or second diagnosis depending upon the ratio of the electric components diagnosed to be said first diagnosis to the electric components diagnosed to be said second diagnosis.

6. The method as set forth in claim 5, in which said electric components are memory cells, and said first diagnosis and said second diagnosis are defective and non-defective.

7. A method for analyzing pieces of data information obtained from an integrated circuit fabricated on a semiconductor wafer, comprising the steps of:
    a) carrying out electric tests for electric components of said integrated circuit and an appearance test for an area of said semiconductor wafer so as to produce pieces of electric test data information each representative of a first diagnosis or a second diagnosis of one of said electric components and a piece of appearance test data information representative of a diagnosis of said area; and
    b) making said pieces of electric test data information representative of either first or second diagnosis depending upon the ratio of the electric components diagnosed to be said first diagnosis to the electric components diagnosed to be said second diagnosis, wherein a high level-analysis is carried out by assigning coordinates on said semiconductor wafer to each electric defect, as represented in said electric test data information, and results of said high level-analysis are used to determine a pattern of said electric defects.

8. A method as recited in claim 7, wherein said electric components are memory cells, and said first diagnosis and said second diagnosis are defective and non-defective, respectively.

* * * * *